(12) United States Patent
Meuris et al.

(10) Patent No.: US 6,530,385 B2
(45) Date of Patent: Mar. 11, 2003

(54) APPARATUS AND METHOD FOR WET CLEANING OR ETCHING A FLAT SUBSTRATE

(75) Inventors: Marc Meuris, Keerbergen (BE); Paul Mertens, Hococht (BE); Marc Heyns, Linden (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 09/751,569

(22) Filed: Dec. 29, 2000

(65) Prior Publication Data

US 2001/0000575 A1 May 3, 2001

Related U.S. Application Data

(62) Division of application No. 08/881,680, filed on Jun. 24, 1996, now Pat. No. 6,247,481.
(60) Provisional application No. 60/020,060, filed on Jun. 24, 1996, and provisional application No. 60/020,373, filed on Jun. 25, 1996.

(30) Foreign Application Priority Data

Dec. 20, 1996 (EP) .............................. 96870162

(51) Int. Cl.[7] ................................ B08B 3/04
(52) U.S. Cl. .................... 134/25.4; 134/32; 134/122 R; 134/902
(58) Field of Search ................ 134/184, 186, 134/902, 200, 64 R, 122 R, 133, 25.4, 32

(56) References Cited

U.S. PATENT DOCUMENTS 1,944,607 A * 1/1934 Millan et al.
2,212,588 A * 8/1940 Csanyi
2,352,709 A * 7/1944 Haase
2,457,128 A * 12/1948 Churnell
2,740,202 A * 4/1956 Fowle
3,011,924 A * 12/1961 Rand
3,021,235 A * 2/1962 Schumacher
3,552,404 A * 1/1971 Kuhn
4,361,444 A * 11/1982 McClanahan et al.
4,475,259 A * 10/1984 Ishii et al.
4,722,355 A * 2/1988 Moe et al.
4,736,758 A * 4/1988 Kusuhara
5,063,951 A * 11/1991 Bard et al.
5,188,135 A * 2/1993 Neumann et al.
5,205,303 A * 4/1993 Gileta
5,246,024 A * 9/1993 Uchino
5,341,825 A * 8/1994 Kobayashi et al.
5,592,958 A * 1/1997 Gardner
5,709,235 A * 1/1998 Akanuma et al.
5,746,234 A * 5/1998 Jones

FOREIGN PATENT DOCUMENTS

JP 5-259136 * 10/1993 ............... 134/902

* cited by examiner

Primary Examiner—Frankie L. Stinson
(74) Attorney, Agent, or Firm—McDonnell Boehnen Hulbert & Berghoff

(57) ABSTRACT

An apparatus for wet cleaning or etching of flat substrates comprising a tank with an inlet opening and outlet opening for said substrates. Said tank contains a cleaning liquid and is installed in a gaseous environment. At least one of the openings is a slice in a sidewall of the tank and is present below the liquid-surface. In the tank there may be a portion above the liquid filled with a gas with a pressure being lower than the pressure within said environment. The method comprises the step of transferring a substrate through the cleaning or etching liquid at a level underneath the surface of said liquid making use of said apparatus.

20 Claims, 11 Drawing Sheets

APPARATUS AND METHOD FOR WET CLEANING OR ETCHING A FLAT SUBSTRATE

This is a divisional of application Ser. No. 08/881,680 filed Jun. 24, 1997 now U.S. Pat. No. 6,247,481 which claims benefit of provisional of No. 60/020,060 filed Jun. 24, 1996 which also claims benefit of No. 60/020,373 filed Jun. 25, 1996.

FIELD OF THE INVENTION

The present invention is related to the fabrication of flat substrates such as semiconductor wafers, flat panel displays, solar cells for microelectronics applications or of flat substrates for other applications which require a cleaning or etching step of said substrates during manufacturing.

The present invention relates more particularly to an apparatus and a method for wet cleaning or etching of said flat substrate.

BACKGROUND OF THE INVENTION

In the processing of semiconductor wafers, the semiconductor surface preparation prior to various processing steps such as oxidation, deposition or growth processes, has become one of the most critical issues. With the rapid approach of subhalf micron design rules, very small particles with submicron dimensions and low levels of metal impurities ($\sim 10^{10}$ atoms/cm$^2$) can have a detrimental effect on process yields. A commonly used technique to reduce foreign particulate matter contamination level on semiconductor surfaces, is the immersion of wafers in liquids such as chemical solutions. The semiconductor wafers are usually placed into a tank or vessel or wet bench, which holds a liquid for cleaning or etching. Such tank or vessel or wet bench is installed in a clean room environment. Often a wet bench contains several vessels or tanks.

Semiconductor wafers or substrates can be immersed into the liquid from the upper part of the tank. Another way to put the substrates in contact with the liquid is to use a door or an entrance at the side wall of the tank and to place a batch of wafers into the tank. After the door is closed and sealed, liquid is flowing into the tank, again to make contact between the cleaning or etching liquid and the substrates. In both approaches, one can switch from one liquid to the other liquid in the same tank. This method is commonly denominated as a single tank processor. Variations of these two techniques are also used for single wafer cleaning or etching purposes. In such a case, the wafer can be placed into a small vessel, which can be larger than the wafer. In some cases, the wafers are immersed into the liquid; in other cases, the wafers are loaded into an empty vessel and the liquid is flowing into the vessel.

A particular apparatus used after cleaning or etching of semiconductor wafers is disclosed in EP 0 385 536, the teaching of which is incorporated herein by reference.

EP-A-407-044 discloses a system having two rooms, each containing a liquid. The system can be used in a semiconductor wafer manufacturing line and allows a wafer to be transported from one room of the system to another room of the system without an intermixing of the liquids occurring. The level of the liquids in the two rooms is adapted as to adjust the respective pressures of the liquids and an elaborate shutter device is provided in the system for opening and closing an opening between the two rooms without causing intermixing through flow and turbulence of the liquids.

A first drawback of the above-mentioned tools and methods is the footprint necessary, i.e., the surface area within a clean room occupied by the tank or vessel. Above-mentioned tools making use of a tank or vessel are big and occupy a large area within a clean room. It is to be understood that clean room area is very expensive due to the costs of maintaining an ultra-clean atmosphere.

Another drawback is the throughput of wafers. When, for example, a single tank processor is used, switching from one liquid to another liquid takes time and the system can have a lower throughput compared to a classical wet bench approach.

Another drawback of the prior art cleaning or etching tools and methods is that a non-uniformity in the cleaning or etching process occurs remains. This is to be understood as follows: when a wafer is dipped in a tank, the bottom part of the wafer is always remaining some longer in the cleaning or etching liquid than the upper part of the wafer. Therefore, the contact-time of several parts of the wafer is not identical.

A further drawback of the prior art cleaning or etching tools and methods is that a drying and/or rinsing step is required after a cleaning or etching step. This drying and/or rinsing step takes extra time and therefore increases the processing time of wafers.

AIM OF THE INVENTION

It is an aim of the present invention to provide an apparatus and a method for wet cleaning or etching a flat substrate wherein the above-mentioned drawbacks of the prior art tools and methods have less impact. The apparatus and the method of the present invention allow a high throughput of flat substrates and a high cycle time, allow a more uniform contact time for several parts of one wafer, allow the development of manufacturing systems with a small footprint and allow flat substrate manufacturing with the wet cleaning or etching step and the required drying procedure being executed in one processing step.

SUMMARY OF THE INVENTION

The first object of the present invention is to provide an apparatus for wet cleaning or etching a flat substrate which comprises a tank with an opening for said substrate, said tank containing a cleaning or etching liquid and being installed in an environment consisting essentially of a gas or of a mixture of gases, such as a clean-room.

The said opening is present below the liquid-surface. The apparatus further comprises means to prevent the liquid from flowing through the opening out of the tank into the environment.

Advantageously, the substrate is transferred from within said environment into said apparatus through said opening. Said apparatus can be for instance used as part of a manufacturing line for the production of said flat substrate or as part of a manufacturing line for developing features in said substrate, such as integrated circuits in a silicon wafer.

In a first aspect of the apparatus according to the invention, said means are realized by the dimensions of the opening, said opening being such narrow that the liquid is prevented from flowing through it due to the surface tension and/or the capillary effect of said liquid.

A first embodiment of the apparatus to achieve this is characterized in that the opening is marginally larger than the thickness of said substrate and is, with respect to the thickness of the wall of the tanks, a lengthened passage.

A second embodiment of the apparatus to achieve this is characterized in that the opening is marginally larger than the thickness of said substrate and is towards the environment a converging passage.

In a second aspect of the present invention, said means comprise a portion in the tank, which portion is above the liquid and is filled with a gas or a gas mixture with a pressure being lower than the gas pressure within said environment. An advantageous embodiment of the apparatus to achieve this, is characterized in that said means comprise a pump connected with the room in the tank for sucking the gas and thereby reducing the gas-pressure in the tank and subsequently reducing the liquid-pressure near the opening.

In a third aspect of the apparatus of the invention, said means comprise a room adjacent to said tank, said room having an opening for said substrate and said room being filled with a gas or a gas mixture with a pressure being higher than the pressure within said environment. The wafer is transferred from said environment through said room into said tank.

In a fourth aspect of the apparatus according to the invention, said tank can be adjacent to a process chamber wherein, for instance, a gas phase etching process of semiconductor wafers can occur. In this embodiment, wafers are transferred from within said environment through said tank into said process chamber. In this way, the process chamber can be isolated from the environment thereby avoiding the introduction of moisture, oxygen or other rest gases in the chamber. Also, the introduction of a wafer into the process chamber through said tank can occur with a relatively simple automation setup. By preference, one tank is located adjacent to the process chamber at the inlet opening of said process chamber and another tank is located adjacent to the process chamber at the outlet opening of said process chamber. Said process chamber can be an etcher or a RTP-system or a EPI-system or another system being part of the manufacturing line of said substrate.

In a fifth aspect of the apparatus of the invention, said means comprise means outside the tank for directing a gas flow towards the opening. In an advantageous embodiment of the invention, the gas flow comprises $N_2$. In another embodiment the gas flow comprises a vapor which is not condensing on said substrate at said opening, said vapor being chosen from a group of substances which are miscible with said liquid and which will form with said liquid a mixture having a surface tension lower than that of said liquid alone. Preferably the vapor is an IPA vapor.

In a further aspect of the apparatus of the invention, said apparatus comprises an inlet opening and an outlet opening. Said inlet opening can be a slice in a first sidewall of said tank and said outlet opening can be in another wall of said tank, said substrate being passed essentially horizontally through said apparatus. In another embodiment said inlet opening is a slice in the bottom of said tank and said outlet opening is in the top of said tank, said substrates being passed essentially vertically through said apparatus.

Yet another embodiment of the apparatus according to the invention is characterized in that the tank further comprises an inlet and an outlet for said liquid, said outlet being near said opening and said means comprises a pump connected to the outlet for sucking the liquid and thereby reducing the liquid-pressure near the opening.

The invention furthermore pertains as a second object to a method of wet cleaning or etching a flat substrate in particular a semiconductor wafer, comprising the steps of putting a substrate via an opening in and out of a tank filled with a cleaning or etching liquid. The method in accordance with the invention is characterized in that the substrate is put into and/or taken out of the cleaning or etching liquid at a level underneath the liquid-surface via an opening in the tank present below the liquid-level in the tank and thereby preventing the liquid from flowing through the opening out of the tank.

More particularly, the method of wet cleaning or etching of a flat substrate in a tank filled with at least one cleaning or etching liquid comprises the steps of:
  loading from within a gaseous environment said substrate through an inlet opening in said tank, said inlet opening being at a level underneath the surface of said liquid; and
  unloading said substrate out of the tank into said gaseous environment while preventing said liquid from flowing out of said tank.

An embodiment of the method according to the invention is characterized in that, gas present above the liquid in the tank is sucked out of the tank to reduce the pressure inside the tank.

A further embodiment of the method according to the invention is characterized in that the liquid is sucked out of the tank near said opening to reduce the liquid-pressure near the opening.

Another embodiment of the method according to the invention is characterized in that a gas flow is directed towards said opening from outside the tank to dry the substrate and to prevent the liquid from flowing out of the tank.

The method of wet cleaning or etching a flat substrate comprises the step of transferring from within a gaseous environment said substrate through a tank filled with a cleaning or etching liquid, said substrate being introduced into said tank through an inlet opening and taken out of said tank through an outlet opening underneath the liquid-surface and are transferred at a uniform speed through said liquid thereby exposing essentially each part of said substrate to said liquid for the same time period.

Said apparatus and said method offer as an advantage the possibility of placing tanks no longer side by side but on top of each other. This approach makes it possible to reduce drastically the footprint of a cleaning or etching system and keeping a high throughput. Also a cleaning tank can be placed directly besides of a next apparatus for further processing. The footprint of the apparatus of the invention furthermore is much smaller than the footprint of a classical wet bench. At the same time the apparatus and method disclosed in the present application allow for keeping a high throughput. Said apparatus and said method offer as another advantage the possibility of achieving a uniform cleaning or etching of wafers being transferred through the cleaning or etching liquid in said tank. As wafers can be transferred at a uniform speed throughout said tank, each part of said wafers is exposed for the same time period to said cleaning or etching liquid. Another advantage of said apparatus and said method is that by the use of dilute chemical mixtures as a cleaning liquid in said tank, a rinsing step after said cleaning or etching step in said tank can be avoided. In this way, a fast processing time of wafers and a high throughput can be achieved. It is disclosed in the prior art that if a cleaning solution is dilute enough, being diluted preferably with DI-water, wafers may be dried immediately without ultra pure water rinsing after cleaning or etching. As a result, no detrimental residues are left behind on the wafer surface. This works well for instance with dilute HCl being diluted with DI-water in the range of pH 2–4. Another possibility is to have a very dilute SC1 cleaning step with a volume mixing ratio of $NH_4OH/H_2O_2/H_2O$ in a range of about 1/1/1000. Another possible solution that can be used to achieve this purpose is to use ozonated water. A detailed description of the use of such dilute chemicals for wafer cleaning/rinsing purposes is given in the co-pending patent application EP 96309145.9 "Drying of Wafers Directly From Chemical Baths with No Ultra-Pure Water Rinse" being co-owned by IMEC and Texas Instruments.

It is to be understood that the apparatus and method disclosed in this document can be used for cleaning or etching of any kind of flat substrates. Thus, flat panel display substrates or solar cell substrates or glass substrates or metal plates or printed circuit boards can be cleaned or etched using a specific embodiment of the apparatus according to this invention.

BRIEF DESCRIPTION OF THE DRAWINGS

The invention will now be further elucidated on the basis of the example embodiments of the apparatus and method according to the invention, as depicted in the drawings. To this end.

DETAILED DESCRIPTION OF PREFERRED EMBODIMENTS

Figure 1:
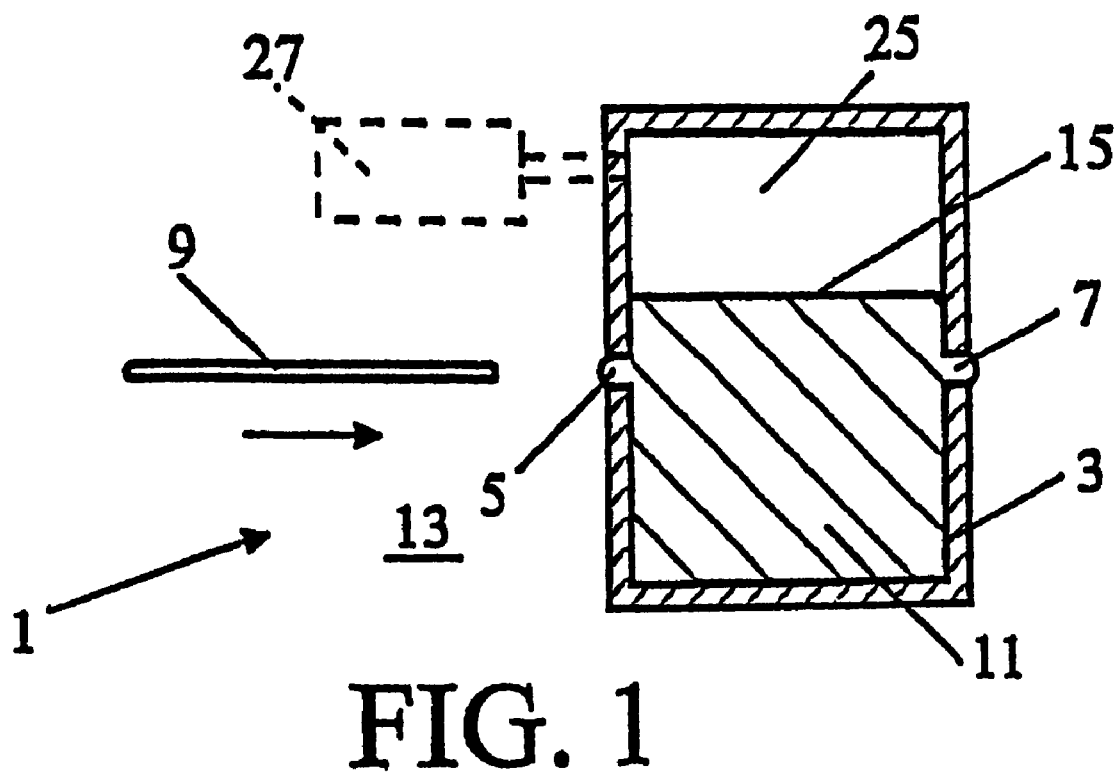
FIG. 1 provides a vertically cross-section view of a first embodiment of the apparatus according to the invention.
Figure 2:
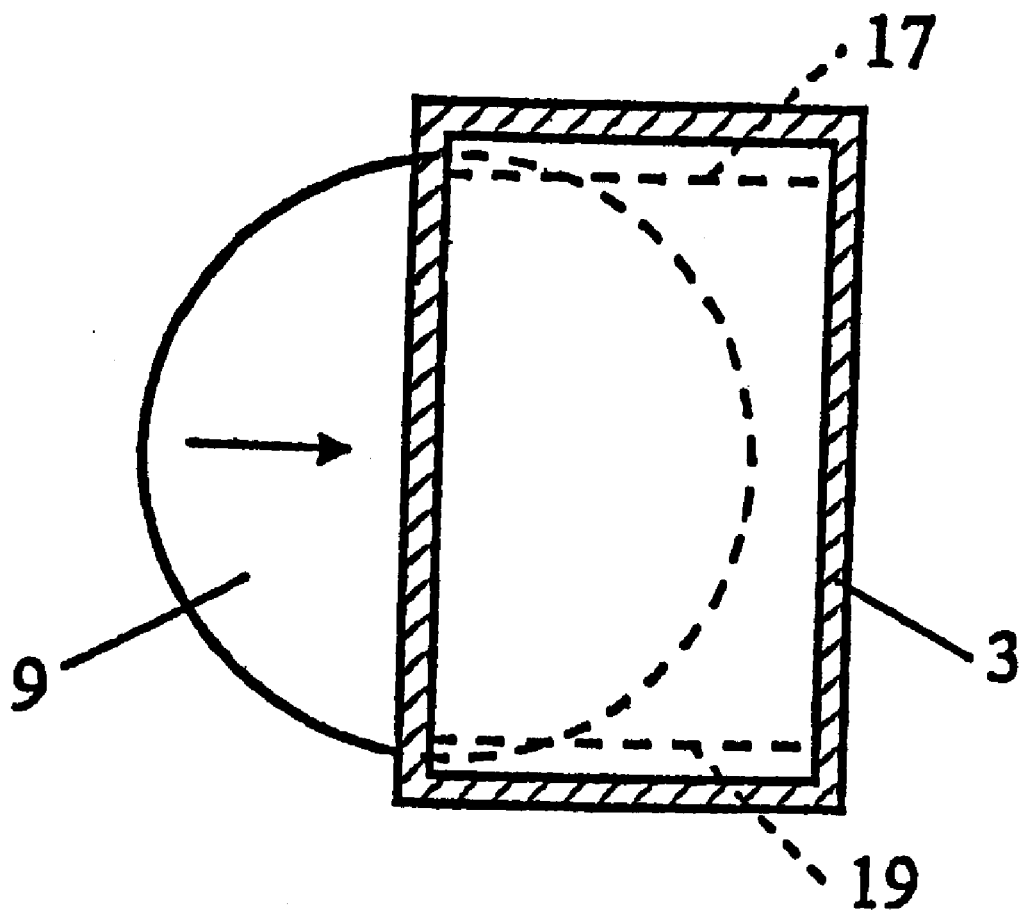
FIG. 2 shows a horizontal cross-section of the apparatus according to the first embodiment.

FIG. 1 shows a first embodiment of the apparatus according to the invention for wet cleaning or etching of flat substrates, in particular semiconductor wafers. The apparatus 1 comprises a tank 3 with an inlet and an outlet opening 5, 7 for a substrate 9. The tank 3 containing cleaning or etching liquid 11 and being installed in a gaseous environment 13, for instance, a clean-room. The openings are present below the liquid-surface 15. The openings 5, 7 are such narrow that the liquid 11 is prevented from flowing through it due to the surface tension and/or the capillary effect of said liquid. FIG. 2 shows a horizontal cross-section of the apparatus with the substrate 9 partly inserted in the tank 3 and sliding through the apparatus. At both sides the tank 3 contains guiding slits 17, 19 for the substrate transport.

Figure 3:
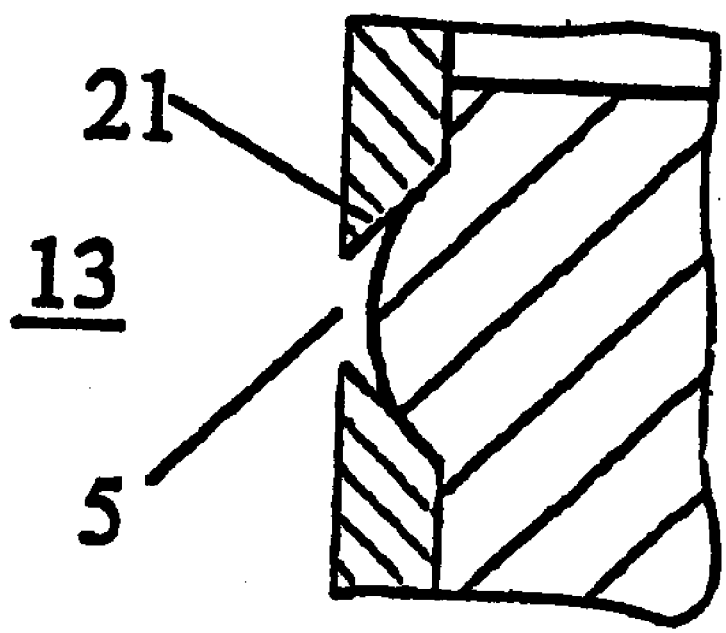
FIG. 3 shows a vertical cross-section of a detail of the apparatus near an opening according to the first embodiment.
Figure 4:
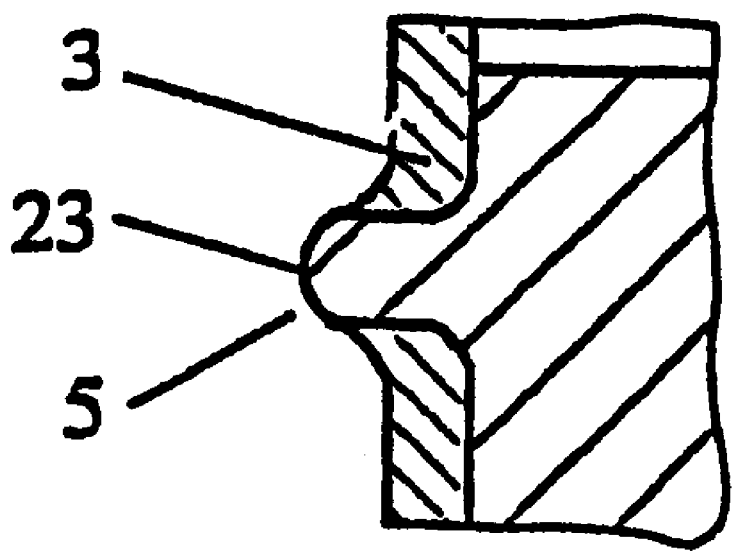
FIG. 4 shows another vertical cross-section of a detail of the apparatus near an opening.

In FIGS. 3 and 4 improved shapes of the openings are shown for maximum prevention of leakage. In the embodiment of FIG. 3 the opening 5 has a tilted angle 21 and converges towards the environment 13. The opening is marginally larger than the thickness of the substrate. In the embodiment of FIG. 4 the opening 5 is lengthened with respect to the thickness of the wall of the tank 3.

The form of the meniscus 23 will also depend on the hydrophobicity of the tank wall material. It is possible that the tank wall material has to be treated in such a way that the contact angle versus the liquid, i.e. the surface tension of the material, has to stay stable during the operation of loading a flat substrate 9 in the tank 3.

Advantageously, the tank wall is made of a material that increases the capillary effect of said liquid. Such material can be a plastic.

The tank 3 comprises a portion 25 above the liquid 11 as can be seen in FIG. 1. This portion 25 is filled with a gas or a gas mixture with a pressure being lower than the pressure within the environment 13. To maintain this reduced pressure a pump 27 may be connected with the portion 25 for sucking the gas and thereby reducing the gas-pressure in the tank and subsequently reducing the liquid-pressure near the openings. This further prevents the liquid from flowing through the openings 5, 7 out of the tank 3. It is advantageous to regulate the pressure such that no air bubbles are sucked through the openings. The pressure in the portion 25 can be for instance 2 to 3 millibar below the pressure of the environment 13. The preferred pressure in the portion 25 is depending on the height of the liquid level above the openings 5, 7. The pressure advantageously is regulated such that the liquid in the tank is impeded from flowing out of the tank.

Figure 5:
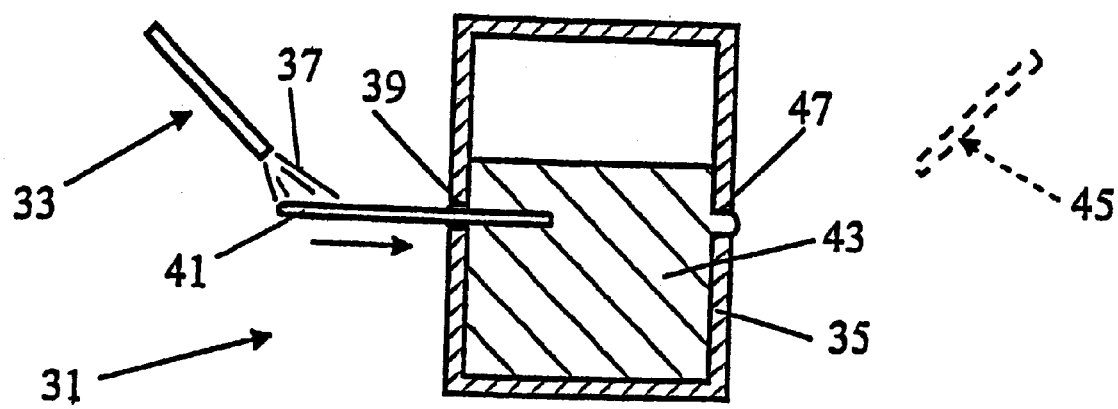
FIG. 5 provides a vertical cross-section view of a second embodiment of the apparatus according to the invention according to the second embodiment.
Figure 6:
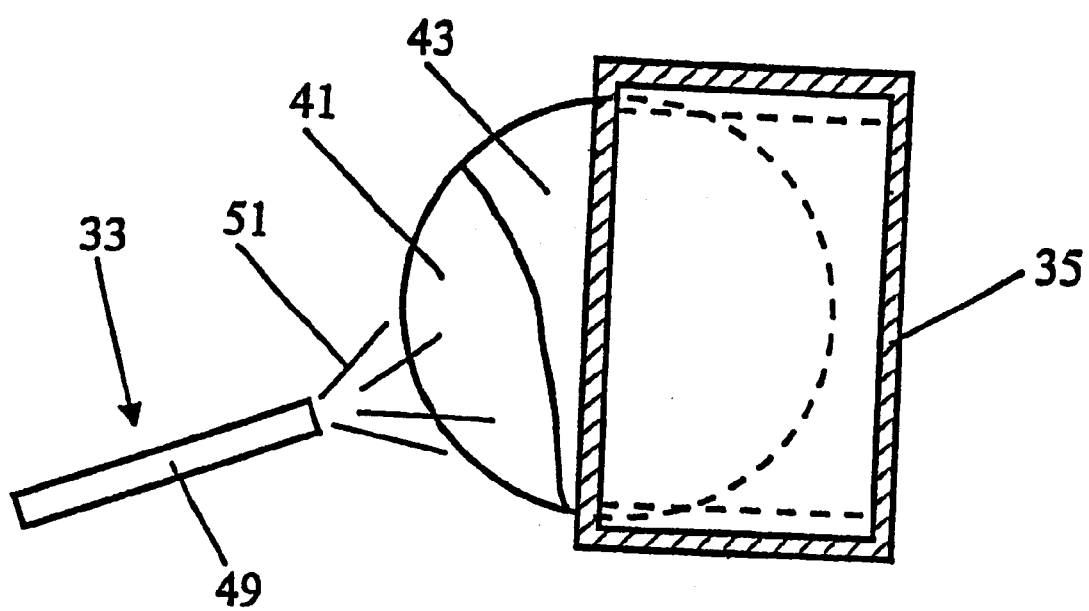
FIG. 6 shows a horizontal cross-section of the apparatus according to the second embodiment.

FIG. 5 shows a second embodiment of the apparatus according to the invention. In this embodiment the apparatus 31 contains means 33 outside the tank 35 for directing a gas flow 37 towards the opening 39 to dry the substrate 41 and preventing the liquid 43 from flowing out of the tank 35. It is also possible to have further means 45 near the outlet opening 47. In the situation shown in FIG. 6 an IPA vapor is used. The means can comprise a tube 49 blowing a vapor comprising IPA possibly mixed with another gas. The inlet and/or outlet atmosphere of the tank can be saturated with said vapor. Using the vapor flow 51 over the outlet opening of the tank, the substrate 41 can be taken out dry. The Marangoni effect is used to change the surface tension at the opening.

Figure 7:
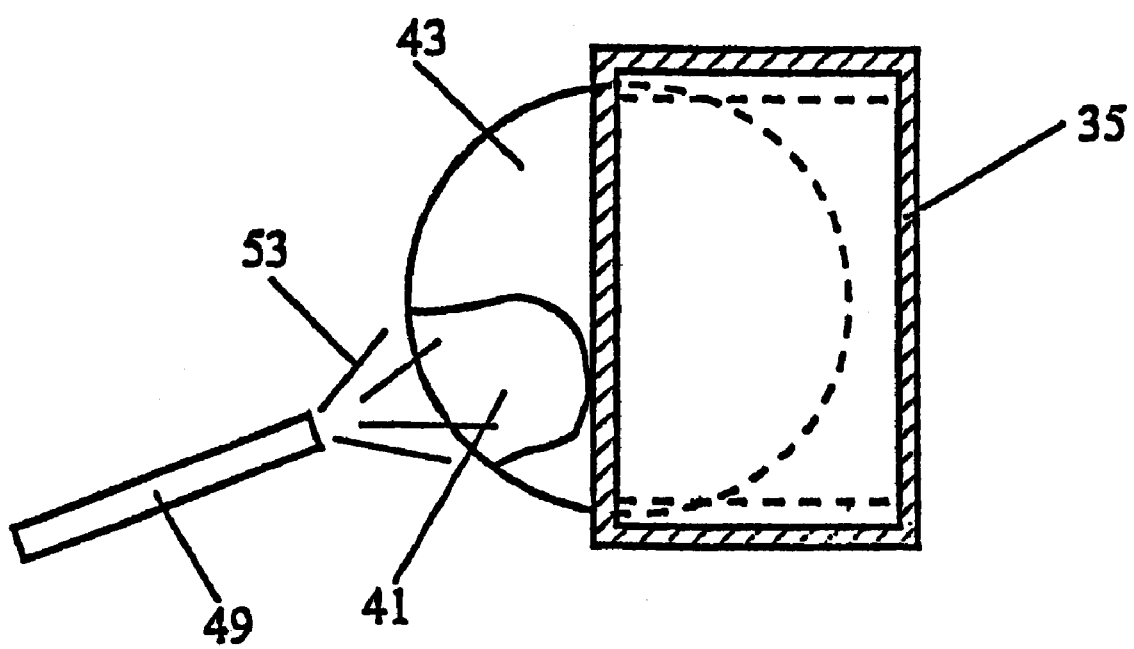
FIG. 7 shows the situation using another gas.

In the situation shown in FIG. 7, $N_2$ is used instead of the IPA vapor. One can observe a drying effect at the blow itself. So, one will have the choice to dry the substrate or with the force of a $N_2$ blow, or with the marangoni effect, or with a combination of both effects.

Figure 8:
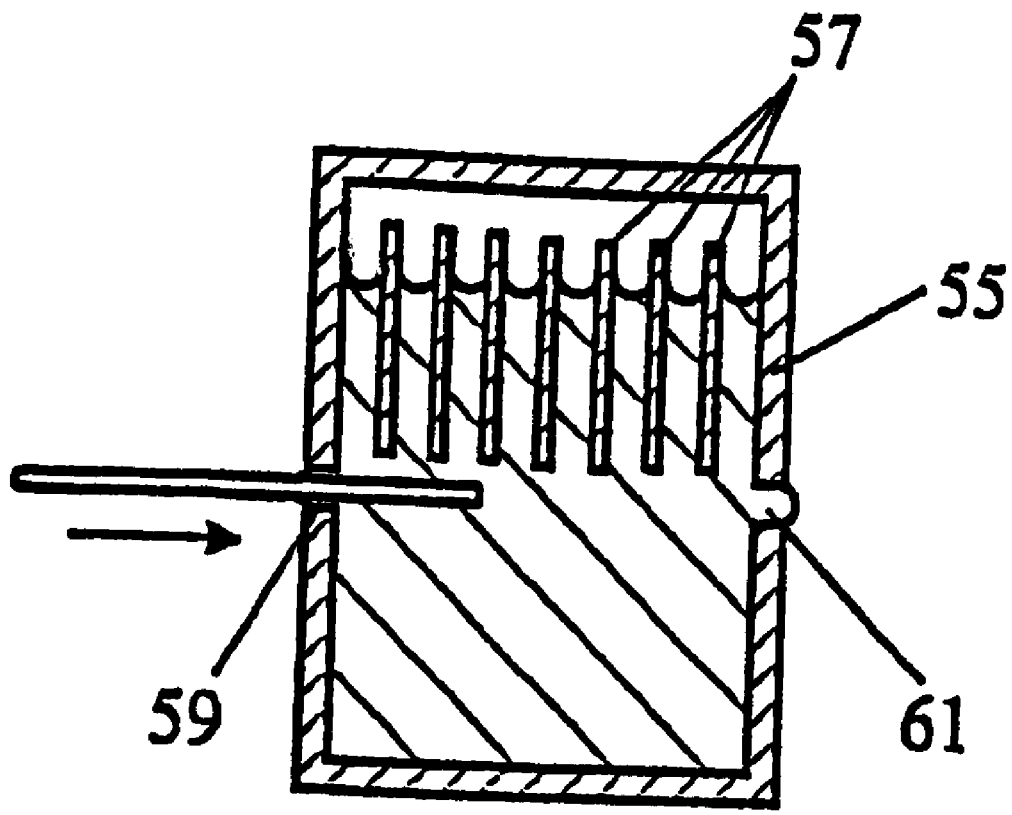
FIG. 8 provides a vertically cross-section view of a third embodiment of the apparatus according to the invention.

Another way to improve the apparatus of the invention is to make use of the capillary force to reduce the pressure at the inlet and outlet openings. This can be done by making use of vertical partitions which create a capillary force on the liquid by which the liquid is kept in the tank. In FIG. 8 this is shown in a third embodiment of the apparatus according to the invention. Inside the tank 55 there are partitions 57 to increase the capillary force and thereby reducing the liquid-pressure near the openings 59, 61.

A modification to this is the use of a tank of capillary dimension of only a few millimeters width (not shown in the drawings). The substrate is processed in a tank and a line of only a few millimeters width of liquid will touch the substrate. Another modification to this is the use of a tank with a height of only a few millimeters so that the liquid stays in by capillary force.

Figure 9:
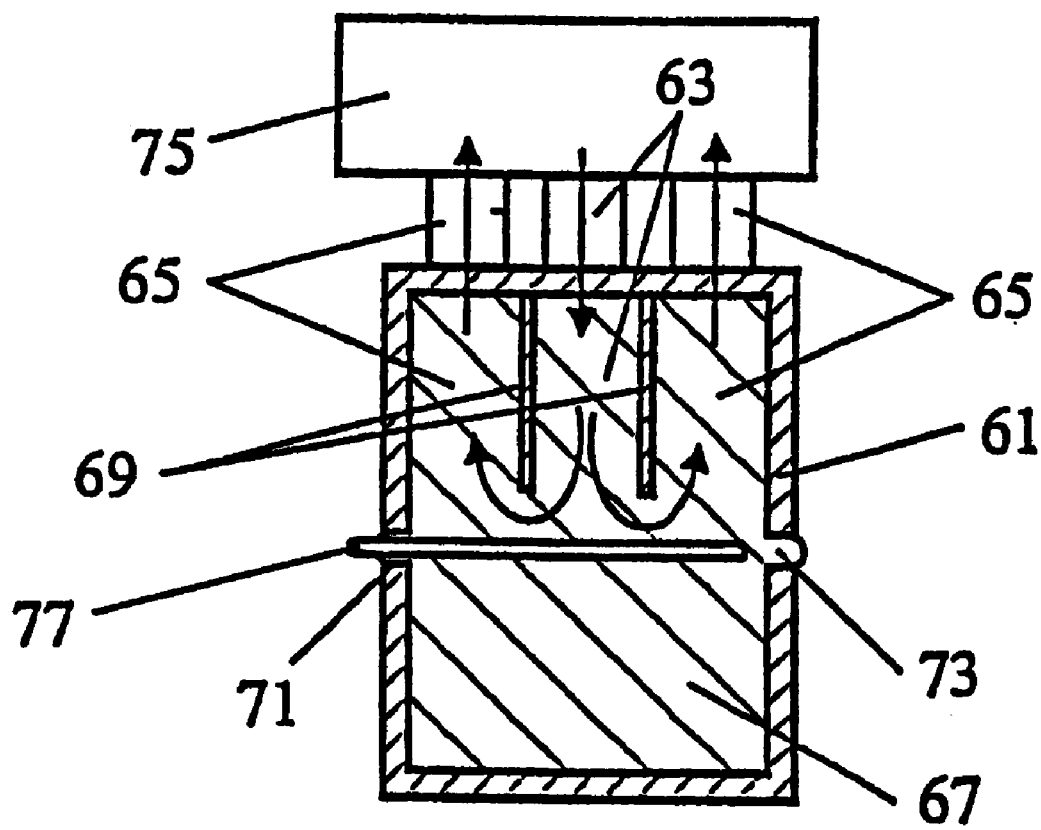
FIG. 9 provides a vertically cross-section view of a fourth embodiment of the apparatus according to the invention.

Another possibility is to make use of a pump to create a small differential pressure at the outlet and inlet openings towards the environment. This is shown in FIG. 9. The tank 61 comprises an inlet 63 and an outlet 65 for the cleaning or etching liquid 67. Vertical plates 69 are inserted to guide the flow as shown by the picture. A pump 75 is connected to the outlet for sucking the liquid and thereby reducing the liquid-pressure near the opening. When the plates 69 are sufficiently near the substrate 77 the velocity of the liquid will be sufficiently high close to the substrate surface to improve the supply of fresh solution.

In the above embodiments the inlet opening is a slice in the sidewall of the tank, the outlet opening is in another wall of the tank and the substrates being passed essentially horizontally through the apparatus. It is possible that only the outlet opening is under the liquid level, the outlet opening thus being in contact with the liquid and the inlet opening not being in contact with the liquid. It is also possible (not shown in the drawings) to make the inlet opening as a slice in the bottom of the tank and the outlet opening in the top of the tank, whereby the substrates being passed essentially vertically through the apparatus.

Figure 11:
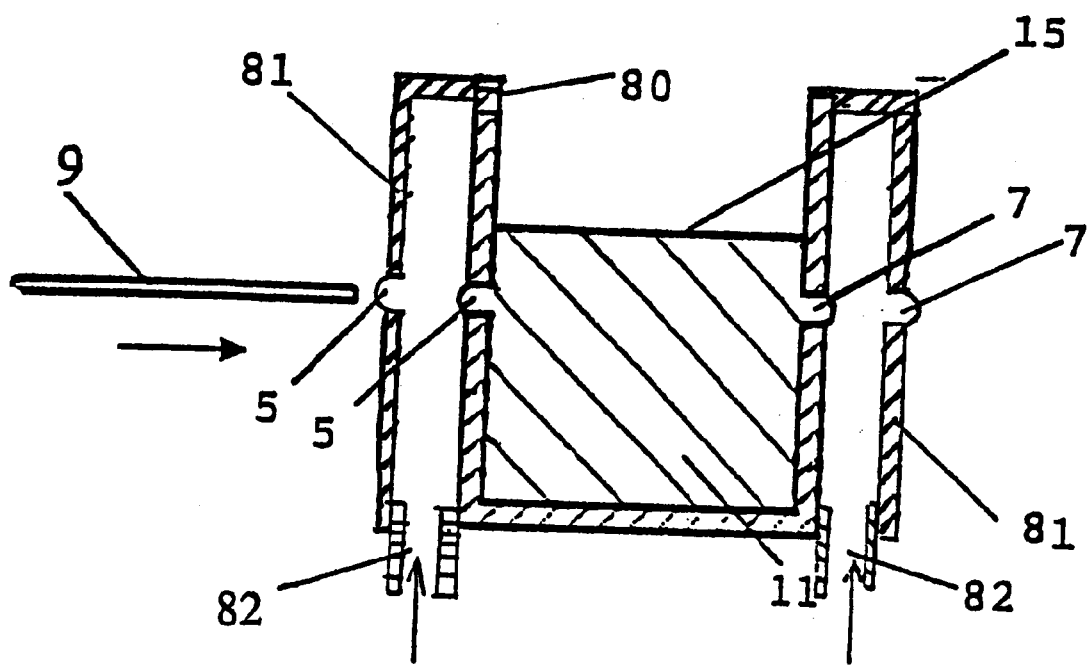
FIG. 11 shows a specific embodiment of the apparatus of the present invention with a room at overpressure adjacent to said apparatus.

As shown in FIG. 11, another embodiment of the apparatus according to the invention has a room 81 adjacent to said tank 80, said room 81 having an opening for said substrates and said room 81 being filled with a gas or a gas mixture with a pressure being higher than the pressure within said environment, the pressure above said liquid in the tank 80 being equal to or lower than the pressure of said environment. The opening of said room 81 advantageously is at the same height as the opening of said tank 80.

A connection 82 is provided on said room 81 to allow making an overpressure in the room 81, preferentially by means of a gas flow being held at a pressure higher than the pressure of said environment.

Figure 10:
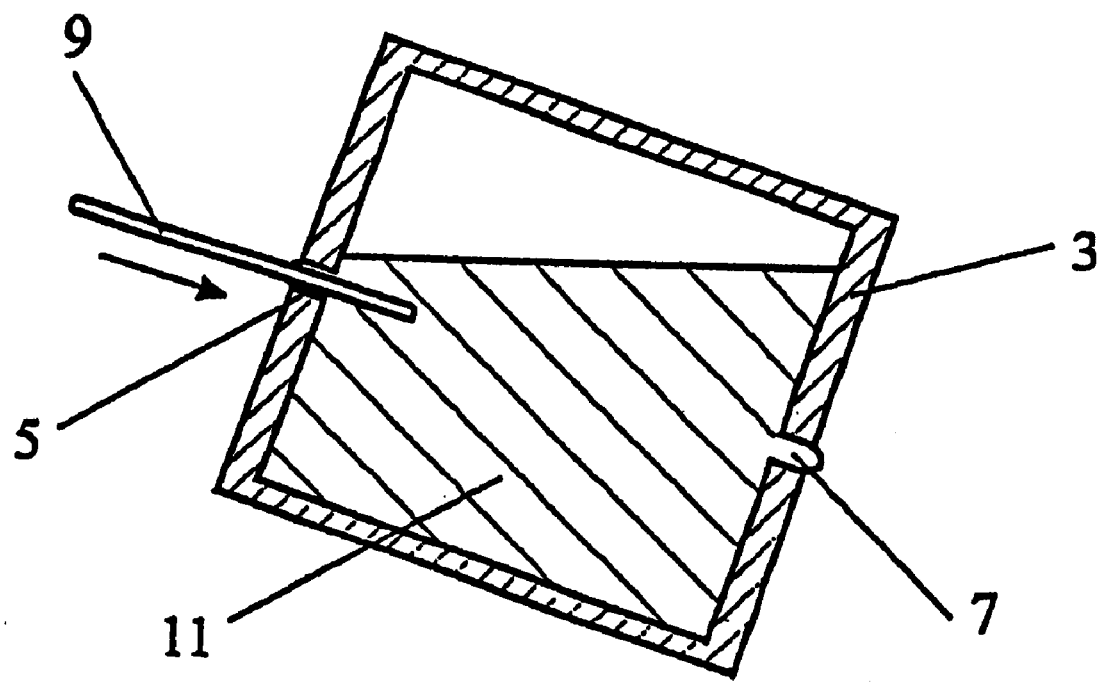
FIG. 10 shows a different mounting of the first embodiment of the apparatus.

Although the invention has been elucidated on the basis of the accompanying drawings in the discussion to this point, it should be noted that the invention is in no way restricted to just those embodiments depicted in the drawings. The invention also encompasses all the derivative embodiments which differ from the depicted embodiments within the scope defined in the claims. As an example, it is also possible to improve the inlet of the tank and facilitate the inlet of the substrate in the tank by tilting the device. This is shown in FIG. 10. This gives the potential that at the inlet no marangoni dry or other force will be necessary while placing the substrate in the device.

What is claimed is:

1. A method of wet cleaning or etching a flat substrate in a tank filled with at least one cleaning or etching liquid, said method comprising the steps of:

loading within a gaseous environment said substrate through an inlet opening in said tank, said inlet opening being at a level underneath the surface of said liquid;

unloading said substrate out of the tank into said gaseous environment; and at least a part of time when loading and unloading said substrate, creating a pressure difference between inside and outside said tank so that pressure inside said tank is lower than pressure outside said tank in order to inhibit liquid from flowing out of said tank.

2. The method of claim 1, wherein a gas flow is directed towards said opening from outside the tank, and wherein said gas flow dries the substrate and prevents the liquid from flowing out of the tank.

3. A method of wet cleaning or etching a flat substrate in a tank filled with at least one cleaning or etching liquid, said method comprising the steps of:

loading within a gaseous environment said substrate through an inlet opening in said tank, said inlet opening being at a level underneath the surface of said liquid; and unloading said substrate out of the tank into said gaseous environment while preventing said liquid from flowing out of said tank, wherein a gas is present above the liquid in the tank, said gas being sucked out of the tank to reduce the pressure inside the tank.

4. A method of wet cleaning or etching a flat substrate comprising:

transferring said substrate through a tank filled with a liquid, said substrate being introduced into said tank through an inlet opening and taken out of said tank through an outlet opening underneath the liquid-surface while preventing said liquid from flowing out of said tank, wherein said substrate is introduced into the tank from a gaseous environment and transferred at a uniform speed through said liquid, thereby exposing each part of said substrate to said liquid for essentially the same period; and at least a part of time when transferring said substrate, creating a pressure difference between inside and outside said tank so that pressure inside said tank is lower than pressure outside said tank in order to inhibit liquid from flowing out of said tank.

5. A method of wet cleaning or etching a flat substrate comprising the step of transferring said substrate through a tank filled with a liquid, said substrate being introduced into said tank through an inlet opening and taken out of said tank through an outlet opening underneath the liquid-surface while preventing said liquid from flowing out of said tank, wherein said substrate is introduced into the tank from a gaseous environment and transferred at a uniform speed through said liquid, thereby exposing each part of said substrate to said liquid for essentially the same period, wherein a gas is present above the liquid in the tank, said gas being sucked out of the tank to reduce the pressure inside said tank.

6. A method for wet cleaning or etching a flat substrate, the method comprising the steps of:

providing a tank with an opening in said tank, wherein said tank contains at least one cleaning or etching liquid and is installed in an environment consisting essentially of a gas or of a mixture of gases;

transferring at least a portion of the flat substrate into or out of said tank; the opening being below the liquid surface; and directing a gas flow towards said opening to inhibit said liquid from flowing through said opening out of said tank into said environment, the step of directing a gas flow being performed at least a part of time during the step of transferring at least a portion of the flat substrate into or out of said tank.

7. The method of claim 6, wherein liquid is prevented from flowing through said opening out of said tank when transferring the substrate into and out of said tank.

8. The method of claim 6, wherein said gas flow comprises $N_2$ as a constituent of the gas flow mixture.

9. The method of claim 6, wherein the step of transferring at least a portion of the flat substrate into or out of said tank includes transferring the substrate horizontally.

10. The method of claim 6, wherein the step of transferring at least a portion of the flat substrate into or out of said tank includes transferring the substrate vertically.

11. The method of claim 6, wherein said tank is adjacent to a process chamber being part of a manufacturing line of said substrate; and wherein said step of transferring at least a portion of the flat substrate into or out of said tank includes transferring said substrate from within said tank into said process chamber.

12. A method for wet cleaning or etching a flat substrate, the method comprising the steps of:

providing a tank with an opening in said tank, wherein said tank contains at least one cleaning or etching liquid and is installed in an environment consisting essentially of a gas or of a mixture of gases;

transferring at least a portion of the flat substrate into or out of-said tank, the opening being below the liquid surface; and preventing said liquid from flowing through said opening out of said tank into said environment during the step of transferring at least a portion of the flat substrate into or out of said tank, wherein inside the tank is a first pressure and outside said tank is a second pressure, and wherein the step of preventing said liquid from flowing through said opening out of said tank includes modifying the first pressure relative to the second pressure so that the second pressure is higher than the first pressure.

13. A method for wet cleaning or etching a flat substrate, the method comprising the steps of:

providing a tank with an opening in said tank, wherein said tank contains at least one cleaning or etching liquid and is installed in an environment consisting essentially of a gas or of a mixture of gases;

transferring at least a portion of the flat substrate into or out of said tank, the opening being below the liquid surface; and preventing said liquid from flowing through said opening out of said tank into said environment during the step of transferring at least a portion of the flat substrate into or out of said tank, wherein said tank includes a second portion, said second portion being above said liquid; and modifying pressure within said second portion so that the pressure in said second portion is lower than pressure within said environment.

14. The method of claim 13, wherein the step of modifying pressure within said second portion includes removing gas in said second portion to reduce the gas-pressure in said second portion and subsequently reduce the liquid-pressure near said opening.

15. A method for wet cleaning or etching a flat substrate, the method comprising the steps of:

providing a tank with an opening in said tank, wherein said tank contains at least one cleaning or etching liquid and is installed in an environment consisting essentially of a gas or of a mixture of gases;

transferring at least a portion of the flat substrate into or out of said tank, the opening being below the liquid surface; and preventing said liquid from flowing through said opening out of said tank into said environment during the step of transferring at least a portion of the flat substrate into or out of said tank, wherein the step of preventing includes directing a gas flow towards said opening, and wherein said gas flow comprises a vapor which does not condense on said substrate at said opening, said vapor being chosen from a group of substances which are miscible with said liquid and which will form with said liquid a mixture having a surface tension lower than that of said liquid alone.

16. The method of claim 15, wherein the vapor comprises IPA.

17. A method for wet cleaning or etching a flat substrate, the method comprising the steps of:

providing a tank with an opening in said tank, wherein said tank contains at least one cleaning or etching liquid and is installed in an environment consisting essentially of a gas or of a mixture of gases;

transferring at least a portion of the flat substrate into or out of said tank, the opening being below the liquid surface; and preventing said liquid from flowing through said opening out of said tank into said environment during the step of transferring at least a portion of the flat substrate into or out of said tank, wherein said substrate is a semiconductor wafer and said environment is a clean room.

18. A method for wet cleaning or etching a flat substrate, the method comprising the steps of:

providing a tank with an opening in said tank, wherein said tank contains at least one cleaning or etching liquid and is installed in an environment consisting essentially of a gas or of a mixture of gases;

transferring at least a portion of the flat substrate into or out of said tank, the opening being below the liquid surface; and at least a part of time when transferring said substrate, creating a pressure difference between inside and outside said tank so that pressure inside said tank is lower than pressure outside said tank in order to inhibit liquid from flowing out of said tank.

19. A method for wet cleaning or etching a flat substrate, the method comprising the steps of:

providing a tank with an opening in said tank, the opening having a thickness, wherein said tank contains at least one cleaning or etching liquid having a uniform depth of a few millimeters and is installed in an environment consisting essentially of a gas or of a mixture of gases;

transferring at least a portion of the flat substrate into or out of said tank, the opening being below the liquid surface, wherein said depth of said liquid inhibiting said liquid from flowing through said opening out of said tank.

20. A method for wet cleaning or etching a flat substrate, the method comprising the steps of:

providing a tank with an opening and a plurality of partitions in said tank, wherein said tank contains at least one cleaning or etching liquid and is installed in an environment consisting essentially of a gas or of a mixture of gases;

transferring at least a portion of the flat substrate into or out of said tank, the opening being below the liquid surface, wherein said partitions reduce liquid pressure near the opening inhibiting said liquid from flowing through said opening out of said tank.

* * * * *